United States Patent
Loeffler et al.

(10) Patent No.: US 11,557,698 B2
(45) Date of Patent: Jan. 17, 2023

(54) CONVERSION ELEMENT AND RADIATION-EMITTING SEMICONDUCTOR DEVICE COMPRISING A CONVERSION ELEMENT OF SAID TYPE

(71) Applicant: OSRAM OLED GMBH, Regensburg (DE)

(72) Inventors: Andreas Loeffler, Neutraubling (DE); Adam Bauer, Donaustauf (DE); Matthias Peter, Regensburg (DE); Michael Binder, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 73 days.

(21) Appl. No.: 16/072,865

(22) PCT Filed: Jan. 17, 2017

(86) PCT No.: PCT/EP2017/050895
§ 371 (c)(1),
(2) Date: Jul. 25, 2018

(87) PCT Pub. No.: WO2017/129446
PCT Pub. Date: Aug. 3, 2017

(65) Prior Publication Data
US 2018/0375002 A1    Dec. 27, 2018

(30) Foreign Application Priority Data
Jan. 27, 2016 (DE) .......................... 102016101442.7

(51) Int. Cl.
*H01L 33/22* (2010.01)
*H01L 33/50* (2010.01)
(Continued)

(52) U.S. Cl.
CPC .......... *H01L 33/502* (2013.01); *H01L 33/007* (2013.01); *H01L 33/0025* (2013.01);
(Continued)

(58) Field of Classification Search
CPC ......... H01L 33/04; H01L 33/06; H01L 33/20; H01L 33/22
See application file for complete search history.

(56) References Cited

U.S. PATENT DOCUMENTS

| | | | | |
|---|---|---|---|---|
| 5,454,002 A | * | 9/1995 | McCann | H01S 5/02 372/34 |
| 6,607,932 B2 | * | 8/2003 | Woodall | B82Y 10/00 257/14 |

(Continued)

FOREIGN PATENT DOCUMENTS

| | | |
|---|---|---|
| CN | 101821866 A | 9/2010 |
| CN | 102362348 A | 2/2012 |

(Continued)

OTHER PUBLICATIONS

Baets et al., foreign priority document EP 15182041 (Aug. 21, 2015) (Year: 2015).*

(Continued)

*Primary Examiner* — Michele Fan
(74) *Attorney, Agent, or Firm* — MH2 Technology Law Group, LLP

(57) ABSTRACT

Disclosed is a conversion element (1) comprising an active region (13) that is formed by a semiconductor material and includes a plurality of barriers (131) and quantum troughs (132), a plurality of first structural elements (14) on a top face (la) of the conversion element (1), and a plurality of second structural elements (15) and/or third structural elements (16) which are arranged on a face of the active region (13) facing away from the plurality of first structural ele- (Continued)

ments (14). Also disclosed is a method for producing a conversion element of said type.

14 Claims, 5 Drawing Sheets

(51) Int. Cl.
  *H01L 33/00* (2010.01)
  *H01L 33/06* (2010.01)
  *H01L 33/24* (2010.01)
  *H01L 33/32* (2010.01)
(52) U.S. Cl.
  CPC ............. *H01L 33/06* (2013.01); *H01L 33/22* (2013.01); *H01L 33/24* (2013.01); *H01L 33/32* (2013.01); *H01L 33/505* (2013.01); *H01L 33/508* (2013.01); *H01L 2933/0041* (2013.01); *H01L 2933/0083* (2013.01)

(56) References Cited

U.S. PATENT DOCUMENTS

| | | | |
|---|---|---|---|
| 8,035,113 B2 | 10/2011 | Moustakas et al. | |
| 8,237,175 B2* | 8/2012 | Moustakas | B82Y 20/00 257/103 |
| 2002/0030197 A1* | 3/2002 | Sugawara | H01L 33/30 257/103 |
| 2003/0168666 A1* | 9/2003 | Okuyama | H01L 33/20 257/80 |
| 2004/0113166 A1* | 6/2004 | Tadatomo | H01L 33/22 257/98 |
| 2005/0008056 A1* | 1/2005 | Albrecht | H01S 5/041 372/75 |
| 2005/0152415 A1* | 7/2005 | Giesen | H01S 5/183 372/34 |
| 2005/0242364 A1* | 11/2005 | Moustakas | B82Y 20/00 257/103 |
| 2006/0054905 A1* | 3/2006 | Schwach | H01L 33/20 257/89 |
| 2006/0273336 A1* | 12/2006 | Fujikura | H01L 33/42 257/98 |
| 2007/0085100 A1 | 4/2007 | Diana et al. | |
| 2007/0120141 A1* | 5/2007 | Moustakas | B82Y 20/00 257/103 |
| 2007/0200122 A1* | 8/2007 | Kim | H01L 33/08 257/79 |
| 2007/0268941 A1* | 11/2007 | Kim | H01S 5/141 372/22 |
| 2008/0217639 A1 | 9/2008 | Kim et al. | |
| 2010/0276710 A1* | 11/2010 | Sampath | B82Y 20/00 257/94 |
| 2010/0283074 A1 | 11/2010 | Kelley et al. | |
| 2010/0288998 A1* | 11/2010 | Kikuchi | H01L 33/06 257/13 |
| 2010/0295075 A1 | 11/2010 | Smith et al. | |
| 2012/0058586 A1 | 3/2012 | Moustakas et al. | |
| 2012/0256161 A1* | 10/2012 | Sabathil | H01L 25/0756 257/13 |
| 2013/0037841 A1* | 2/2013 | Choi | H01L 33/20 257/98 |
| 2013/0228742 A1* | 9/2013 | Tanaka | H01L 33/06 257/13 |
| 2013/0334493 A1 | 12/2013 | Luo | |
| 2014/0070243 A1* | 3/2014 | Kim | H01L 27/156 257/89 |
| 2014/0145228 A1 | 5/2014 | Bohm et al. | |
| 2014/0209921 A1* | 7/2014 | Kusunoki | H01L 33/007 257/76 |
| 2014/0306213 A1* | 10/2014 | Sato | H01L 51/5072 257/40 |
| 2015/0083993 A1* | 3/2015 | Nagata | H01L 33/06 257/13 |
| 2015/0171263 A1* | 6/2015 | Nakatsu | H01L 33/007 257/13 |
| 2016/0056352 A1* | 2/2016 | Koike | H01L 22/12 257/98 |
| 2016/0240679 A1* | 8/2016 | Chen | H01L 29/205 |
| 2018/0239089 A1* | 8/2018 | Baets | H01L 33/0045 |

FOREIGN PATENT DOCUMENTS

| | | |
|---|---|---|
| CN | 104040750 A | 9/2014 |
| CN | 104781941 A | 7/2015 |
| DE | 102015109761 A1 | 12/2016 |
| EP | 2206164 | 7/2010 |
| JP | 2002-057359 A | 2/2002 |
| JP | 2003-115605 A | 4/2003 |
| JP | 3614070 B2 * | 1/2005 |
| JP | 2006-237264 A | 9/2006 |
| JP | 2007-533164 A | 11/2007 |
| JP | 2008-216146 A | 9/2008 |
| JP | 2010-510659 A | 4/2010 |
| JP | 2010-541295 A | 12/2010 |
| JP | 2011-507272 A | 3/2011 |
| KR | 20090112307 A | 10/2009 |
| WO | 2008/092437 A1 | 8/2008 |
| WO | 2011080219 A1 | 7/2011 |

OTHER PUBLICATIONS

Schiavon, D. et al.: "Optically pumped GaInN/GaN multiple quantum wells for the realization of efficient green light-emitting devices" Applied Physics Letters; vol. 102; 2013; pp. 113509-1-113509-4.
"New Osram conversion technology for backlighting LEDs" OSRAM Opto Semiconductors GmbH; press release; 2015; p. 1.
Notice of Reason for Rejection received in Japanese Patent Application No. 2018-538166 dated Sep. 3, 2019.
Decision of Rejection in Japanese Application No. 2018-538166 dated Mar. 24, 2020, 13 pages.
Chinese Notice of Allowance (with English Translation) in corresponding Chinese Application No. 201780008191.8 dated Nov. 2, 2021, 7 pages.

* cited by examiner

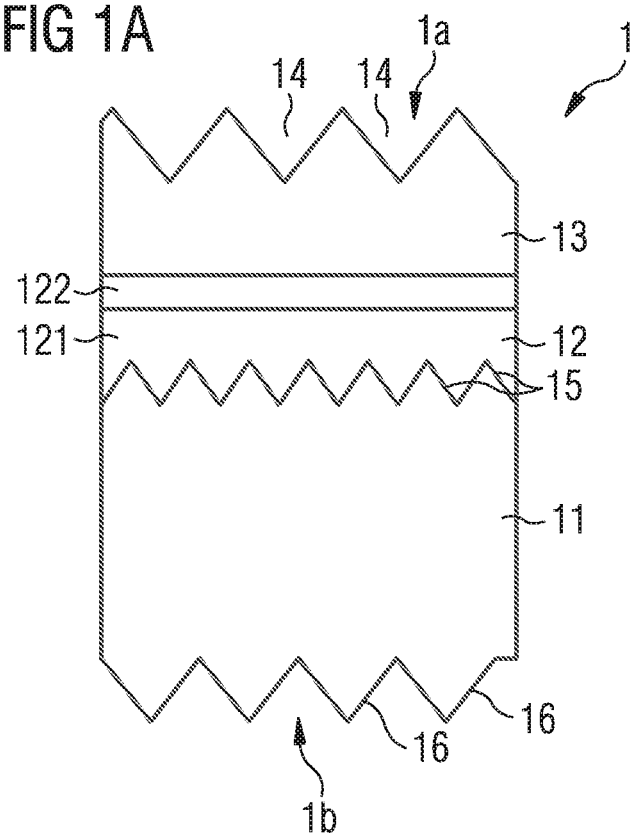
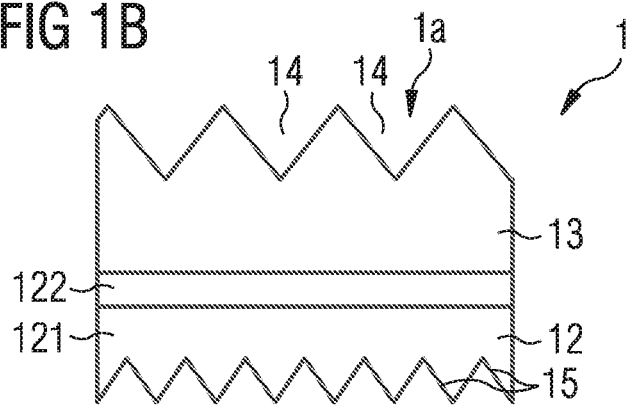

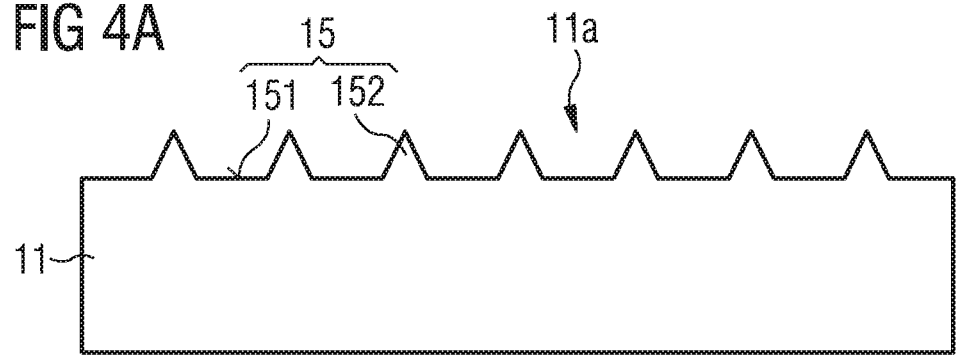
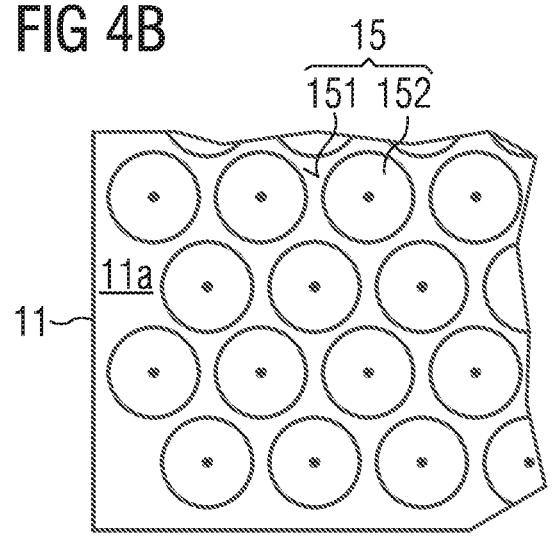

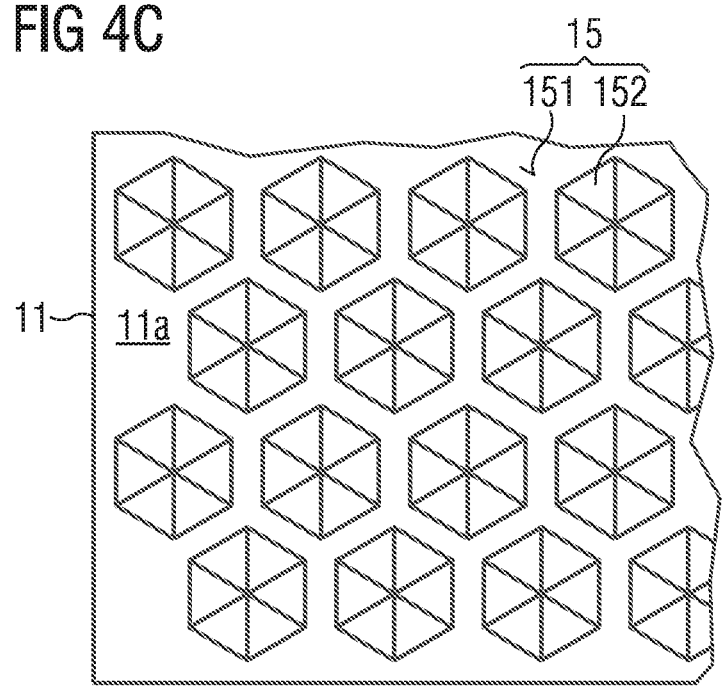
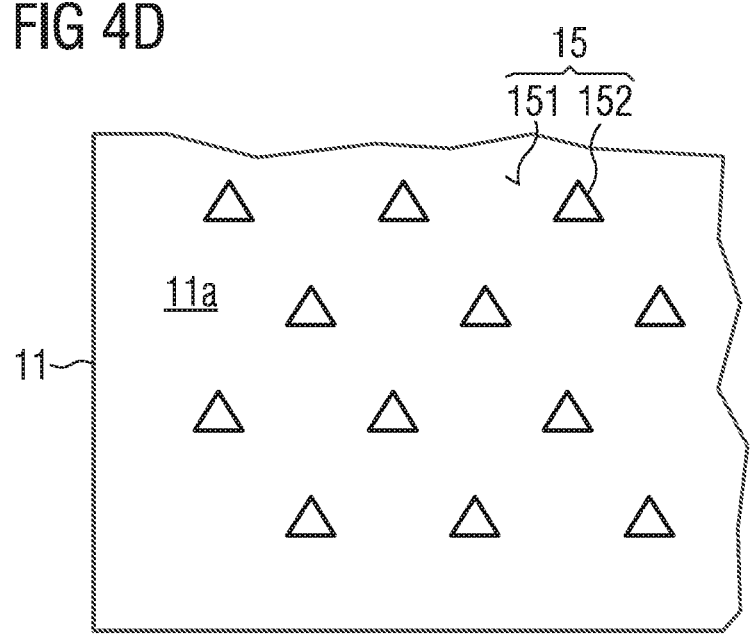

CONVERSION ELEMENT AND RADIATION-EMITTING SEMICONDUCTOR DEVICE COMPRISING A CONVERSION ELEMENT OF SAID TYPE

A conversion element is specified.

The publication WO 2008/092437 A1 describes an arrangement and a method for producing mixed light. For generating green light, in this arrangement an oxynitride- or silicate-based luminescence conversion element is used.

One problem to be solved is to specify a conversion element with which colored light can be generated particularly efficiently by optically pumping the conversion element.

The conversion element is provided in particular for optical pumping the conversion element by a pump source. This means that in the conversion element a secondary radiation with a longer wavelength than the pump radiation is preferably generated by pumping with a primary radiation. For example, the conversion element can be pumped with UV radiation or blue light and emit longer-wave light, in particular green or red light, as secondary radiation. In this case, the conversion element can both be provided to generate mixed radiation from the secondary radiation and the primary radiation and also to emit secondary radiation mainly. In this case, the conversion element is set up for the so-called full conversion of the primary radiation.

According to at least one embodiment of the conversion element, the conversion element comprises an active region that is formed with a semiconductor material. The active region includes a variety of barriers and quantum wells.

For example, the active region is formed in the material system InGaN, for generation of green secondary radiation, or in the material system InGaAlP, for the generation of red secondary radiation. The active region comprises a quantum well structure with a plurality of barriers and quantum wells. The secondary radiation emitted by the conversion element during operation is generated by the recombination of charge carriers in the quantum wells. The charge carriers are generated by absorption of primary radiation which is of shorter wavelength than the secondary radiation, for example in the barriers.

For example, the active region may be made by epitaxial growth, for example, in an MOVPE (Metal Organic Vapor Phase Epitaxy) system. That means, the active region may comprise epitaxially grown layers or consist of epitaxially grown layers.

According to at least one embodiment of the conversion element, the conversion element comprises a plurality of first structural elements, which are arranged on a top side of the conversion element. The first structural elements are for example depressions and elevations, which are arranged on the top side of the conversion element. For example, the first structural elements may be formed on the active region or in the active region. In this case, the first structural elements preferably have structure sizes which enable the secondary radiation generated during operation in the conversion element to be influenced by scattering. The structure size of the first structural elements is preferably between at least 100 nm and at most 10 µm, in particular between at least 0.5 µm and 1.5 µm. The structure size can be, for example, the distance between two elevations, the diameter of an elevation, the diameter of a depression, the distance between two depressions, the height of an elevation and/or the depth of a depression of a first structural element.

According to at least one embodiment of the conversion element, the conversion element comprises a plurality of second structural elements and/or third structural elements, which are arranged on a side of the active region facing away from the plurality of first structural elements.

The second and third structural elements may, for example, likewise be depressions and/or elevations. The first and/or second structural elements preferably have structure sizes that enable the structural elements to scatter the primary radiation entering the conversion element. For example, the structure size of the second and/or the third structural elements is between at least 100 nm and at most 10 µm, in particular between at least 0.5 µm and 5 µm. The structure size may be, for example, the distance of two elevations, the diameter of an elevation, the diameter of a depression, the distance between two depressions, the height of an elevation and/or the depth of a depression.

According to at least one embodiment of the conversion element, the conversion element comprises an active region which is formed with a semiconductor material and comprises a plurality of barriers and quantum wells, a plurality of first structural elements which are arranged on a top side of the conversion element and a plurality of second structure elements and/or third structure elements arranged on a side of the active region facing away from the plurality of first structure elements.

In the conversion element described here, the active region in which the secondary radiation is generated during operation of the conversion element is arranged at least between the first structural elements and the second or third structural elements. The first structural elements are intended to scatter radiation emerging from the conversion element, in particular secondary radiation. The second and the third structural elements are predominantly intended to scatter radiation entering the conversion element, in particular primary radiation, with which the conversion element is pumped during operation. In this way, it is possible for the plurality of first structural elements to increase the probability of the emission of electromagnetic radiation from the conversion element. The plurality of second and/or third structural elements increases the probability of the entry of primary radiation, which is provided for optically pumping the conversion element, into the active region.

The conversion elements described here is based, inter alia, on the following considerations: For example, to generate green light, it is possible to use direct green light-generating InGaN-based light-emitting diodes. However, these have an increased forward voltage relative to the physical bandgap. In addition, they have a strong sub-linear light-current dependence. Both problems lead to a reduction in efficiency to about 50 to 60 percent compared to blue light-emitting iluminating diodes. Furthermore, such green light-emitting iluminating diodes have a very poor charge carrier confinement, resulting in a loss of charge carriers in the active zone. Due to this fact, the directly green light-emitting iluminating diodes have a lower efficiency, especially at high temperatures.

In principle, it is possible to produce colored non-blue light, for example green light, via phosphorus conversion. In this case, for example, a conversion element is used which comprises an organic or inorganic, in particular ceramic, phosphor (phosphorus). This enables the production of, for example, green light with high efficiency, but involves a very broad emission spectrum, which is disadvantageous for applications where good color rendering is desired.

In the case of the conversion element described here, a semiconductor material is used as the active region, which comprises a large number of barriers and quantum wells, with optical pumping of the active region being provided.

The optical pumping of the active region significantly reduces the charge carrier density per quantum well compared to an electrical injection of charge carriers. As a result, both a better high-current efficiency and a much narrower spectral half-width can be realized in comparison to the phosphor conversion. A conversion element described here is therefore characterized by a particularly high efficiency with a particularly narrow line width of the generated light.

Surprisingly, it has now been shown that the efficiency of a conversion element in which the active region is formed with a semiconductor material and comprises a plurality of barriers and quantum wells can be significantly increased by a combination of input and output coupling structures. It has surprisingly been found that the arrangement of the active region between a plurality of first structural elements on a side and a plurality of second and / or third structural elements on another side allows an increase in efficiency by more than 30 percent compared to conversion elements that do not contain any structural elements for example smooth outer surfaces within the framework of production tolerance.

According to at least one embodiment of the conversion element, the conversion element is free of electrical connections. That means, the conversion element is an electrically inactive component, which is not intended for electrical operation. In particular, the conversion element comprises no electrical contact layers or connecting surfaces. In the operation of the conversion element, therefore, there is no electrical injection of charge carriers into the active region, but these are generated only by optical pumping of the conversion element, in particular of the active region.

According to at least one embodiment, the conversion element is free of a carrier. A carrier which is used, for example, for growing a semiconductor body of the conversion element can in this case be detached from the carrier. For example, the carrier is detached from the semiconductor body by means of mechanical and / or chemical methods and / or a laser separation method. Non-transparent materials can then be used in particular for the carrier. Such a conversion element, which is free of a carrier, consists for example of epitaxially grown semiconductor material.

According to at least one embodiment of the conversion element, the conversion element comprises a carrier which is formed with a radiation-transmissive material. The carrier is in particular formed with an electrically insulating material. This is possible in the present case, since the conversion element is in particular electrically inactive and is not intended for electrical operation.

For example, the carrier may be a carrier which is attached to the active region after the production of the active region. The carrier may then consist, for example, of a radiation-transmissive material, such as glass, sapphire or AlN, or contain at least one of these materials.

Moreover, it is also possible that the carrier is a part of a growth substrate which has been used in the production of the active region of the conversion element. In this case, the active region is epitaxially grown on the growth substrate and the carrier and active region are monolithically bonded together.

According to at least one embodiment of the conversion element, the plurality of second structural elements is arranged on an outer surface of the carrier facing the active region, and/or the plurality of third structural elements is arranged on an outer surface of the carrier facing away from the active region. For example, if the conversion element comprises only the first and the second structural elements, then the second structural elements are arranged between the carrier and the active region. The second structural elements can then, for example, be a structuring of the material of the carrier or a further material is applied to produce the second structural elements on the outer surface of the carrier facing the active region and thus arranged between carrier and active region. If, alternatively or additionally, the conversion element comprises the plurality of third structural elements, these are arranged on the outer surface of the carrier facing away from the active region. Again, the third structural elements may be formed from the material of the carrier, or another material may be applied to the carrier to form the third structural elements.

According to at least one embodiment of the conversion element, the conversion element comprises a carrier which is formed with a radiation-transmissive material, wherein the plurality of second structural elements is arranged on an outer surface of the carrier facing the active region and/or the plurality of third structural elements are arranged on an outer surface of the carrier facing away from the active region.

According to at least one embodiment of the conversion element, in the operation of the conversion element, the plurality of first structural elements increase the probability of emission of electromagnetic radiation from the conversion element and the plurality of second and third structural elements increase the probability of the entry of electromagnetic radiation into the active region of the conversion element. That means, the first structural elements are, in particular, coupling-out structures which are set up to guide electromagnetic radiation out of the conversion element in a particularly efficient manner. The second and third structural elements are coupling-in structures which are provided, in particular, to guide pump radiation with high efficiency, that means, in particular by avoiding total reflection of pump radiation on the outer surface or in the conversion element into the active region.

According to at least one embodiment of the conversion element, in operation of the conversion element, the plurality of second and third structural elements increase the probability of emission of electromagnetic radiation from the conversion element and the plurality of first structural elements increase the probability of the entry of electromagnetic radiation into the active region of the conversion element. That means, the second and third structural elements are, in particular, coupling-out structures which are set up to guide electromagnetic radiation out of the conversion element in a particularly efficient manner. The first structural elements are coupling-in structures which are provided, in particular, to guide pump radiation with high efficiency, that means, in particular by avoiding total reflection of pump radiation on the outer surface or in the conversion element into the active region. If the first structural elements are directed to the pump source and serve as coupling-in structures, this has the further advantage that the active region can be in indirect contact, for example, with the pump source, and in this way a cooling of the conversion element takes place very efficiently during operation.

According to at least one embodiment of the conversion element, the conversion element comprises the plurality of second structural elements and the plurality of third structural elements. That means, in a conversion element of this embodiment, both types of structural elements provided for coupling-in electromagnetic radiation are present in the conversion element. This further increases the efficiency of the conversion element compared to a conversion element which has only the second or only the third structural elements.

According to at least one embodiment, the active region comprises at least 10, in particular at least 35 quantum wells. It has been shown that such a large number of quantum wells enables a particularly good absorption of the primary radiation in the active region, so that the conversion element is suitable for full conversion of the primary radiation into secondary radiation.

According to at least one embodiment of the conversion element, the plurality of first structural elements is formed by V-defects in the active region. The V-defects are funnel-shaped and/or inverse pyramid-shaped depressions which have, for example, a hexagonal edge. These V-defects can be generated, for example, in the production of the active region by adjusting the growth conditions, for example by lowering the growth temperature. In particular, the production of thick barriers and the production of a thick active region favor the formation of V-defects. The generation of V-defects is described in another context, for example in the publication WO 2011/080219 A1, the disclosure content of which is hereby expressly incorporated by reference.

According to at least one embodiment of the conversion element the carrier is part of a growth substrate for the active region and the plurality of second structural elements is formed by a level surface having a plurality of elevations disposed on the growth surface of the carrier facing the active region. The level surface and the elevations can be generated by structuring the material of the carrier. In this case, the carrier may be, for example, a prestructured sapphire carrier. Such a carrier is described in another context in the German patent application DE 102015109761.3, the disclosure content of which is hereby expressly incorporated by reference.

Alternatively, it is possible that the elevations are generated, for example, as masks or mask islands of an ELOG (epitaxial lateral over growth) method. The elevations are then formed, for example, with a material such as silicon dioxide or silicon nitride.

According to at least one embodiment of the conversion element, the plurality of third structural elements is formed by roughening the outer surface of the carrier facing away from the active region. The roughening of the carrier can be produced, for example, by lapping. Furthermore, it is possible that the roughening is produced by etching with or without an etching mask.

Furthermore, a radiation-emitting semiconductor device is specified. In the case of the radiation-emitting semiconductor device, in particular a conversion element described here can be used. That means, all features disclosed for the conversion element are also disclosed for the semiconductor device and vice versa.

According to at least one embodiment of the radiation-emitting semiconductor device, the radiation-emitting semiconductor device comprises a pump source which generates primary radiation during operation. The pump source may be, for example, a light-emitting diode chip or a laser diode chip. The primary radiation of the pump source is preferably electromagnetic radiation from the spectral range of UV radiation and/or blue light.

According to at least one embodiment of the radiation-emitting semiconductor device, the radiation-emitting semiconductor device comprises a conversion element described here, wherein the pump source is mechanically connected to the conversion element. For example, the conversion element is attached to a radiation exit surface of the pump source at the pump source. The conversion element can for example be placed on the pump source and fixed there.

According to at least one embodiment of the radiation-emitting semiconductor device, the plurality of first structural elements of the conversion element are arranged on the side of the active region facing away from the pump source, at least the plurality of second structural elements or at least the plurality of third structural elements are arranged between the pump source and the plurality of first structural elements. That means, the conversion element is applied to the pump source in such a way that the second structural elements and optionally the third structural elements are arranged between the pump source and the active region. In this way, the second and third structural elements act as coupling-in structures, whereas the first structural elements act as coupling-out structures.

Alternatively, it is possible for the plurality of first structures to act as coupling-in structures and to face the pump source. That means, the plurality of first structural elements is then arranged between the pump source and further structural elements. If the first structural elements are directed to the pump source and serve as coupling structures, this has the further advantage that the active region can be, for example, in indirect contact with the pump source, and in this way a cooling of the conversion element takes place very efficiently during operation.

According to at least one embodiment of the radiation-emitting semiconductor region, secondary radiation is generated in the active region when excited by the primary radiation. The secondary radiation is lower energy than the primary radiation and includes, for example, the spectral range between green and red light.

According to at least one embodiment of the radiation-emitting device, the radiation-emitting semiconductor device comprises a pump source which generates primary radiation during operation and a conversion element as described here. The pump source is mechanically connected to the conversion element, the plurality of first structural elements of the conversion element are arranged on the side of the active region facing away from the pump source, and at least the plurality of second structural elements or at least the plurality of third structural elements are arranged between the pump source and the plurality of first structural elements. In the active region of the conversion element, secondary radiation is generated during operation when the radiation-emitting semiconductor device is excited by the primary radiation.

According to at least one embodiment of the radiation-emitting semiconductor device, a connection region which mediates the mechanical connection between the conversion element and the pump source is arranged directly between the conversion element and the pump source. The connection region is formed, for example, by a radiation-transmissive adhesive which mechanically connects the pump source to the conversion element and simultaneously produces an optical coupling between the conversion element and the pump source.

In the following, the conversion element described here as well as the radiation-emitting semiconductor device described here are explained in more detail on the basis of exemplary embodiments and the associated figures.

FIGS. 1A and 1B show exemplary embodiments of a conversion element described here on the basis of a schematic sectional illustration.

Figure 3A:
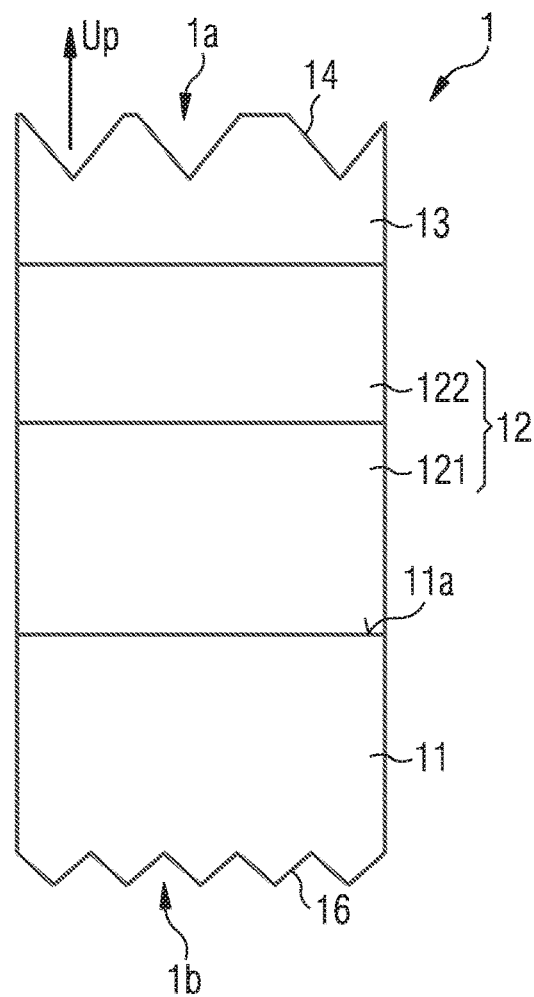
Figure 3B:
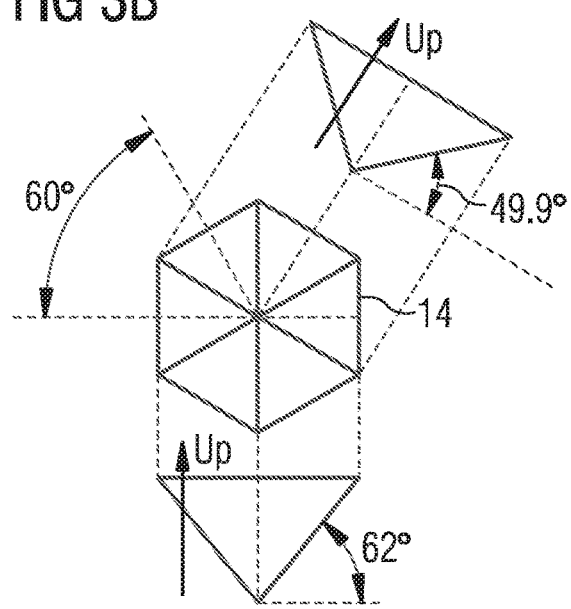
Figure 3C:
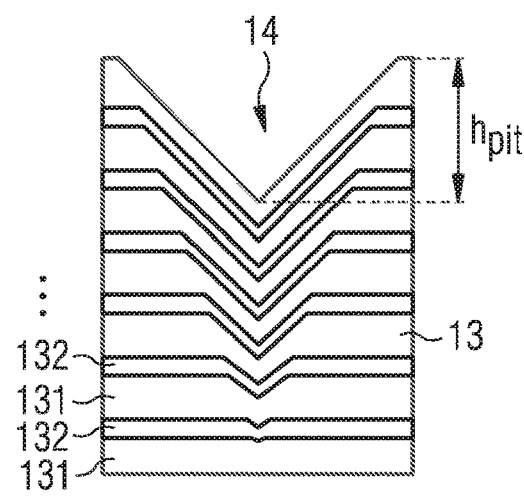

In connection with the schematic representations of FIGS. 3A, 3B, 3C, another exemplary embodiments of a conversion element described here is explained in more detail.

In connection with the schematic representations of FIGS. 4A, 4B, 4C and 4D, another exemplary embodiments of a conversion element described here is explained in more detail.

Same, similar or equivalent elements are provided in the figures with the same reference numerals. The figures and the proportions of the elements shown in the figures with each other are not to be considered to scale. Rather, individual elements may be exaggerated in size for better representability and/or better intelligibility.

FIG. 1A shows a schematic sectional illustration of a first exemplary embodiment of a conversion element described here. The conversion element 1 comprises a carrier 11 which is radiation-transmissive, in particular transparent. For example, the carrier 11 is a part of a sapphire growth substrate on which the subsequent layers are epitaxially grown. The carrier 11 is therefore monolithically connected to the other components of the conversion element. The conversion element 1 further comprises an intermediate region 12 which is formed, for example, with GaN or InGaN or InAlGaN. The electronic bandgap is greater in the intermediate region 12 than in, for example, quantum wells of the active region 13. For example, the intermediate region 12 includes a first subarea 121, which may be a 3 µm thick nominally undoped GaN layer.

Furthermore, the intermediate region 12, for example, comprises a second subarea 122, which directly follows the side of the first subarea 121 facing away from the carrier 11. The second subarea 122 is, for example, a 2 µm thick n-doped GaN layer, which is doped, for example, with silicon. The active region 13 follows directly on the side of intermediate region 12 facing away from the carrier 11. The active region 13 comprises a plurality of InGaN-based quantum wells 132, which are separated from one another by GaN-based, InGaN-based or InAlGaN-based barriers 131. The active region 13 is, for example, nominally undoped. The active region 13 comprises at least 10, in particular at least 35, for example exactly 40 quantum wells 132. It has been found that such a large number of quantum wells enables a particularly good absorption of the primary radiation in the active region, so that the conversion element for full conversion of the primary radiation is suitable in secondary radiation.

On the side of the conversion element 1 facing away from the carrier 11, the top side 1a, which is opposite to the bottom side 1b, the first structural elements 14 are formed. The first structural elements 14 are, for example, roughenings produced by etching, wherein the etching can take place with or without a mask or structures created by self-organized growth, for example V-defects. The first structural elements 14 serve as coupling-out structures for increasing the probability of emission for secondary radiation generated during operation in the conversion element.

The conversion element further comprises second structural elements 15, which are arranged between the carrier and the intermediate region 12. The second structural elements 15 are, for example, an ELOG mask or ELOG mask islands or the depressions and elevations of the structured substrate surface.

Furthermore, the conversion element 1 comprises on its bottom side 1b, which is arranged on the side of the intermediate region 12 facing away from the active region 13, third structural elements 16, which are, for example, roughenings which are produced by lapping, periodic structuring or self-organized structuring.

In contrast to the exemplary embodiment of the conversion element shown schematically in FIG. 1A, it is also possible that the conversion element does not comprise either the second structural elements 15 or the third structural elements 16.

In the schematic sectional illustration of FIG. 1B, a conversion element 1 is shown, in which the carrier 11 is removed, for example, by a chemical method, a mechanical method and/or a laser separation method. The conversion element 1 consists in this embodiment exclusively of epitaxially produced layers. Advantageously, the plurality of second structural elements 15 can be generated by a pre-structured carrier 11 or by means of the carrier release process. Furthermore, in this embodiment it is advantageously possible that the carrier may be formed with a non-transparent material. This expands the choice in the selection of the carrier 11.

Figure 2A:
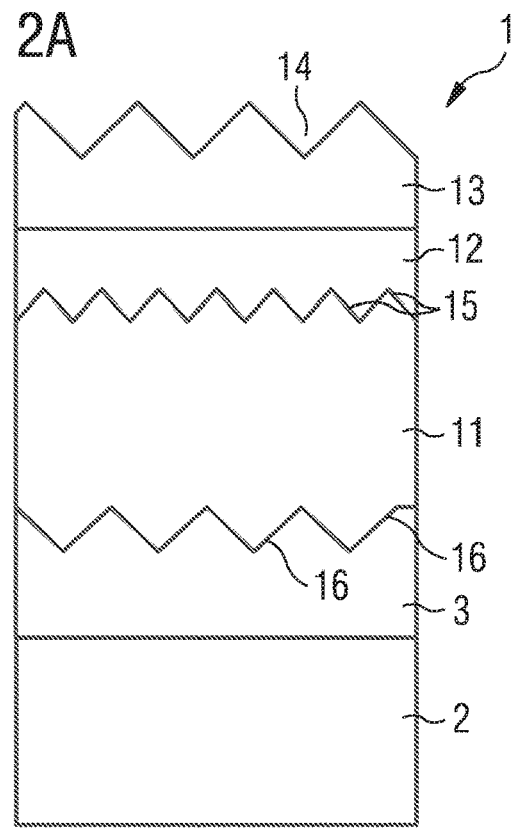
FIGS. 2A and 2B show exemplary embodiments of a radiation-emitting semiconductor device described here on the basis of a schematic sectional illustration.
Figure 2B:
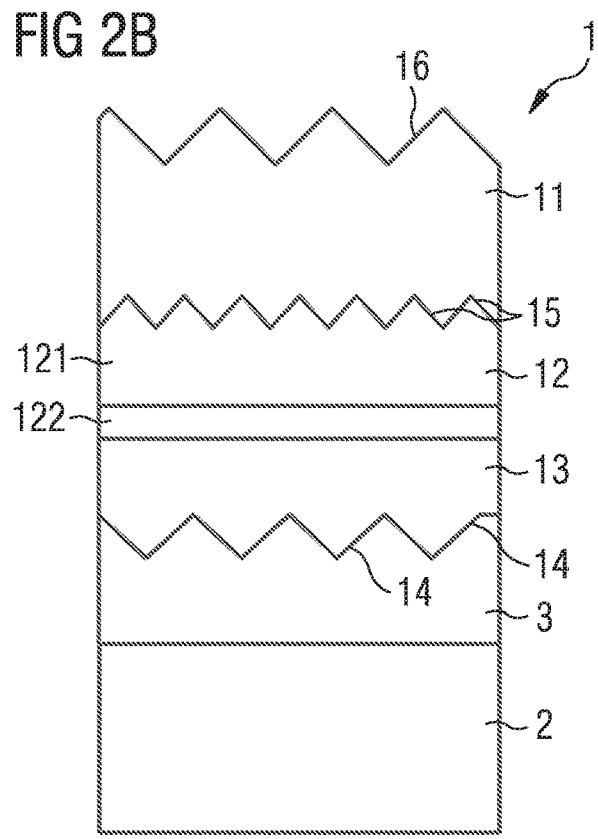

In connection with the schematic sectional illustration of FIG. 2A, an exemplary embodiment of a radiation-emitting semiconductor device described here is explained in more detail. In addition to the conversion element 1, the radiation-emitting semiconductor device comprises the pump source 2, which is mechanically fixedly connected to the conversion element 1 via the connecting area 3. In the present case, the pump source 2 is, for example, a blue light-emitting diode chip which radiates at least a majority of the emitted radiation through the outer surface facing the conversion element 1.

The connecting area 3 is, for example, a radiation-transmissive, in particular transparent adhesive which, in addition to the mechanical connection, also causes an optical coupling of the pump source 2 to the conversion element 1.

The conversion element 1 may be, for example, the conversion element explained in more detail in connection with FIG. 1A or 1B or any other conversion element described here.

In connection with the schematic sectional illustration of FIG. 2A, an exemplary embodiment of a radiation-emitting semiconductor device described here is explained in more detail. In addition to the conversion element 1, the radiation-emitting semiconductor device comprises the pump source 2, which is mechanically fixedly connected to the conversion element 1 via the connection region 3. In the present case, the pump source 2 is, for example, a blue light-emitting diode chip which radiates at least a majority of the emitted radiation through the outer surface facing the conversion element 1.

The connecting area 3 is, for example, a radiation-transmissive, in particular transparent adhesive which, in addition to the mechanical connection, also causes an optical coupling of the pump source 2 to the conversion element 1.

In contrast to the embodiment of FIG. 2A, the conversion element 1 is arranged with the first structural elements 14 facing pump source 2. In this way, the active region 13 is arranged as close as possible to the pump source 2. This results in improved cooling of the active region 13 and reduced absorption of pump radiation on the way to the active region 13. The first structural elements 14 act as coupling-in structures for the pump radiation. The second structural elements 15 and optionally the third structural elements 16 act as coupling-out structures. The first structural elements 14 are designed, for example, as V-defects with a diameter of 0.5 µm. The second structural elements 15 can be produced by structuring the carrier 11 and have, for example, a diameter of 2.8 µm. For example, the diameter of the first structural elements 14 in this embodiment may be generally smaller than the diameter of the second and/or third structural elements 15,16. For example, that of the second and/or third structural elements 15,16 is at least 2 times, in particular at least 5 times, as large as the diameter of the first structural elements 14.

The conversion element 1 may further be the conversion element explained in more detail in connection with FIG. 1A or 1B or any other conversion element described here.

In connection with the schematic representation of FIGS. 3A to 3C, a further embodiment of a conversion element 1 described here is explained in more detail. In the conversion element 1, which is explained in connection with the schematic sectional illustration of FIG. 3A, is omitted in comparison to the conversion element of FIG. 1A on the second structural elements 15. That means, the conversion element 1 comprises the first structural elements 14 on the top side 1a of the conversion element and the third structural elements 16 on the bottom side 1b of the conversion element.

The first structural elements 14 are, for example V-defects, as explained in more detail in connection with FIGS. 3B and 3C. The arrow marked Up indicates the growth direction with which the active region 13 is deposited on the carrier 11 in FIG. 3B. The carrier 11 is, for example, the part of a sapphire growth substrate. The subsequent layers are deposited, for example, on the (0001) growth surface 11a of the substrate.

By setting suitable growth temperatures, for example a reduced growth temperature, funnel-shaped depressions with a hexagonal edge, as shown schematically in the plan view in FIG. 3B and in the sectional illustration in FIG. 3C, are formed in the active region 13. At the side of the growth side facing away from the growth substrate active region 13, the V-defects act as coupling-out structures and thus as the first structural elements 14.

The size, for example the diameter, of the V-defects correlate with the thickness of the active layer 13 and is here about 500 nm. Furthermore, the V-defects are not closed again and remain open. In contrast, when V-defects are used in a conventional light-emitting diode chip, they are (partially) closed again, for example by the growth of a p-side of the semiconductor body, whereas in the present case they are not overgrown.

In connection with the schematic representations of FIGS. 4A to 4D, a variant of the second structural elements 15 is explained in more detail. FIG. 4A shows the carrier 11 in a sectional illustration, FIGS. 4B and 4C show a plan view of the growth surface 11A of the carrier 11. As shown in the sectional illustration of FIG. 4A, the elevations 152 protrude from the plane formed by the level surface 151. The three-dimensionally shaped elevations 152 extend upwards away from the level surface 151. In this case, the cross section of the elevations 152 may be round and in particular circular, as shown for example in FIG. 4B. The elevations 152 can then be designed, for example, as conical elevations. Alternatively, it is possible for the elevations 152, as shown in FIG. 4C, to also have an angular, for example hexagonal or triangular, see FIG. 4D, cross section, so that the elevations 152 are formed as pyramidal elevations on the level surface 151.

The carrier 11 may be a sapphire carrier which is part of a sapphire growth substrate. The level surface 151 is then preferably formed by a crystallographic c-surface of the sapphire. The second structural elements 15 can be produced, for example, by etching the carrier 11. They act both as optically active structural elements and to improve the crystal quality in the growth of the subsequent layers of the conversion element and thus increase the efficiency of the conversion element.

The invention is not limited by the description based on the embodiments of these. Rather, the invention encompasses any novel feature as well as any combination of features, which includes in particular any combination of features in the patent claims, even if this feature or combination itself is not explicitly stated in the patent claims or exemplary embodiments.

The priority of German Patent Application DE 102016101442.7 is claimed, the disclosure of which is hereby expressly incorporated by reference.

REFERENCE NUMERAL LIST conversion element
1a top side
1b bottom side
11 carrier
11a growth surface
12 intermediate region
121 first subarea
122 second subarea
13 active region
131 barrier
132 quantum well
14 first structural elements
15 second structural elements
151 level surface,
152 elevation
16 third structural elements
2 pump source
3 connecting area

The invention claimed is:

1. Conversion element with
an active region formed with a semiconductor material and comprising a plurality of barriers and quantum wells,
a plurality of first structural elements arranged on a top side of the conversion element, and
a plurality of second structural elements and third structural elements arranged on top of each other in separate planes on a side of the active region facing away from the plurality of first structural elements,
an intermediate region adjacent to the active region, wherein
the intermediate region has a greater electronic bandgap than the active region,
the plurality of first structural elements is formed in the active region, the conversion element is optically pumped during operation with a pump radiation which is a primary radiation and emits secondary radiation by conversion of the primary radiation into secondary radiation with a longer wavelength than the pump radiation,
the first structural elements are coupling-out structures and the second and third structural elements are coupling-in structures or the first structural elements are coupling-in structures and the second and third structural elements are coupling-out structures,
the first structural elements differ in their size from the second and/or third structural elements, and
the conversion element comprises no electrical contact layers or electrical connecting surfaces.

2. Conversion element according to claim 1 with
a carrier which is formed with a radiation-transmissive material, wherein
the plurality of second structural elements is arranged on an outer surface of the carrier facing the active region, and/or
the plurality of third structural elements is arranged on an outer surface of the carrier facing away from the active region.

3. Conversion element according to claim 1, in which the plurality of first structural elements increases the probability of an emission of electromagnetic radiation from the conversion element, and the plurality of second structural elements and third structural elements increase the probability of the entry of electromagnetic radiation into the active region.

4. Conversion element according to claim 1, in which the active region comprises at least 10 quantum wells.

5. Conversion element according to claim 1, in which the plurality of first structural elements is formed by V-defects in the active region.

6. Conversion element according to claim 1, in which the plurality of first, second and/or third structural elements is formed by at least one etching process.

7. Conversion element according to claim 1, with a carrier, wherein the carrier is part of a growth substrate having a growth surface facing the active region for the active region, and the plurality of second structural elements comprises a level surface having a plurality of elevations disposed on the growth surface of the carrier facing the active region.

8. Conversion element according to claim 1, in which the plurality of third structural elements is formed by roughening the outer surface of the carrier facing away from the active region.

9. Radiation-emitting semiconductor device with
a conversion element according to claim 1, and
a pump source which generates the primary radiation during operation, wherein
the pump source is mechanically connected to the conversion element,
the plurality of first structural elements of the conversion element is arranged on the side of the active region facing the pump source,
the plurality of first structural elements is arranged between the pump source and the plurality of second structural elements or third structural elements, and
in the active region of the conversion element the secondary radiation is generated upon excitation by the primary radiation.

10. Radiation-emitting semiconductor device according to claim 9, in which a connection area is arranged directly between the conversion element and the pump source and mediates the mechanical connection between the conversion element and the pump source.

11. Conversion element according to claim 1, in which the active region comprises at least 35 quantum wells.

12. Conversion element according to claim 1, in which the intermediate region is formed with at least one of the following materials: GaN, InGaN, InAlGaN.

13. Conversion element according to claim 1, in which the intermediate region comprises a first subarea and a second subarea, wherein the first subarea is formed from a nominally undoped GaN layer and the second subarea is formed from an n-doped GaN layer.

14. Conversion element with
an active region formed with a semiconductor material and comprising a plurality of barriers and quantum wells,
a plurality of first structural elements arranged on a top side of the conversion element, and
a plurality of second structural elements and third structural elements arranged on top of each other in separate planes on a side of the active region facing away from the plurality of first structural elements,
an intermediate region adjacent to the active region, wherein
the intermediate region has a greater electronic bandgap than the active region,
the plurality of first structural elements is formed in the active region, the conversion element is optically pumped during operation with a pump radiation which is a primary radiation and emits secondary radiation by conversion of the primary radiation into secondary radiation with a longer wavelength than the pump radiation,
the second and the third structural elements are predominantly intended to scatter radiation entering the conversion element with which the conversion element is pumped during operation,
the first structural elements have a smaller diameter than the second and/or third structural elements, and
the conversion element comprises no electrical contact layers or electrical connecting surfaces.

* * * * *